United States Patent [19]

Lena

[11] Patent Number: 4,538,112

[45] Date of Patent: Aug. 27, 1985

[54] DETECTOR USING DELAYED AND UNDELAYED INPUTS FOR DEMODULATING FM OR PM SIGNALS

[75] Inventor: Richard M. Lena, Tewksbury, Mass.

[73] Assignee: Wang Laboratories, Inc., Lowell, Mass.

[21] Appl. No.: 412,626

[22] Filed: Aug. 30, 1982

[51] Int. Cl.³ ............................................. H03D 3/06
[52] U.S. Cl. .................................... 329/145; 329/110; 329/140; 455/214
[58] Field of Search ................. 329/50, 110, 122, 140, 329/145, 206; 375/80; 455/214

[56] References Cited

U.S. PATENT DOCUMENTS

| | | | |
|---|---|---|---|
| 3,392,337 | 7/1968 | Neuburger | 329/145 |
| 3,778,727 | 12/1973 | Williams | 329/145 X |
| 3,821,654 | 6/1974 | Van Anrooy | 329/140 X |
| 4,307,347 | 12/1981 | Thomson | 329/206 X |
| 4,375,618 | 3/1983 | Jett, Jr. | 329/145 X |

FOREIGN PATENT DOCUMENTS

| | | | |
|---|---|---|---|
| 2522519 | 9/1976 | Fed. Rep. of Germany | 329/50 |
| 2821773 | 11/1978 | Fed. Rep. of Germany | 329/50 |
| 2492188 | 4/1982 | France | |
| 0044459 | 4/1979 | Japan | 329/110 |
| 2089152 | 6/1982 | United Kingdom | 329/110 |

Primary Examiner—Eugene R. LaRoche
Assistant Examiner—Robert J. Pascal
Attorney, Agent, or Firm—Michael H. Shanahan; Gregory P. Gadson

[57] ABSTRACT

A differential detector is disclosed that is used in FM or PM receivers for demodulating a modulated carrier signal. The detector uses a mixer/phase detector for combining an intermediate frequency phase modulated or frequency modulated signal with the same signal delayed to demodulate the signal. Delay inherrent in an IF filter of the receiver in which the detector is utilized for this purpose. The undelayed and delayed signals required for operation of my differential detector are obtained from the input and output respectively of the IF filter. The output from my detector has spurious signals not typically present in the output of prior art differential detectors but these spurious signals are removed by a filter including low pass, band reject and/or notch filtering to yield only the modulating signal.

2 Claims, 2 Drawing Figures

DETECTOR USING DELAYED AND UNDELAYED INPUTS FOR DEMODULATING FM OR PM SIGNALS

FIELD OF THE INVENTION

This invention relates to detectors for demodulating frequency and phase modulated signals.

BACKGROUND OF THE INVENTION

In the prior art many types of detectors have been utilized for demodulating frequency and phase modulated carrier signals. One particular type of detector is a differential detector. A differential detector utilizes a delay element to delay an intermediate frequency (IF) frequency or phase modulated signal input to the detector, and the delayed signal is then mixed with the undelayed signal to demodulate the IF signal. The detector output signal is then passed through a filter leaving only the desired demodulated signal. In these prior art differential detectors the element providing the signal delay is usually the most significant part of the detector. At frequencies above in the order of 50 MHz delay lines and lumped delay networks as delay elements are practical and may be used as the delay element. At frequencies below in the order of 50 MHz delay lines are impractical as delay elements in that they are too bulky and expensive. Digital delay elements such as shift registers are practical up to approximately 2 MHz. There are no practical delay elements that can be used in differential detectors between approximately 2 MHz and 50 MHz. Thus, there is a need to solve the problem of expensive and bulky delay elements and secondarily to solve the frequency limitation problem of prior art detectors.

My invention solves these problems in the prior art. I provide a differential detector that doesn't utilize its own delay element as is done in the prior art, and can operate at frequencies heretofore impractical in the prior art. By deleting the delay element a cost savings is realized as it is often the most significant cost item in the detector. A space savings is also realized because the delay element is eliminated, and when the delay element is a delay line the space savings is appreciable.

SUMMARY OF THE INVENTION

In accordance with the teaching of my invention I provide a differential detector for demodulating the frequency or phase modulated carrier signals received by a receiver to retrieve the modulating signal originally used to modulate the carrier signal without using a conventional delay element in the detector. More particularly, rather than use a typical delay element I obtain signals for the two inputs of my differential detector from the input and the output of an IF filter within the receiver. The IF filter introduces delay such that the signal output from the IF filter is delayed with respect to the signal input thereto. This delay is sufficient for the proper operation of my novel detector. An advantage to using the IF filter as the delay element is that an IF filter has characteristics such as phase linearity that would have to be duplicated in delay lines in the prior art. The output from my detector has unwanted adjacent channel signals that are not typically present in the output of prior art differential detectors. These unwanted signals are easily removed by a filter, typically filtering the output of prior art differential detectors, by the addition of band reject and notch sections to the low pass filters normally used in such differential detector output filters.

DESCRIPTION OF THE DRAWING

My invention will be better understood on reading the following detailed description in conjunction with the drawing in which.

DETAILED DESCRIPTION

The theory of differential detection is found in a paper published in the January, 1965 issue of the *Bell System Technical Journal* starting on page 111 and entitled Differential Detection of Binary FM, by R. R. Anderson, W. R. Bennett, J. R. Davey, and J. Salz, which paper is incorporated herein by reference along with other papers cited in that paper.

Figure 1:
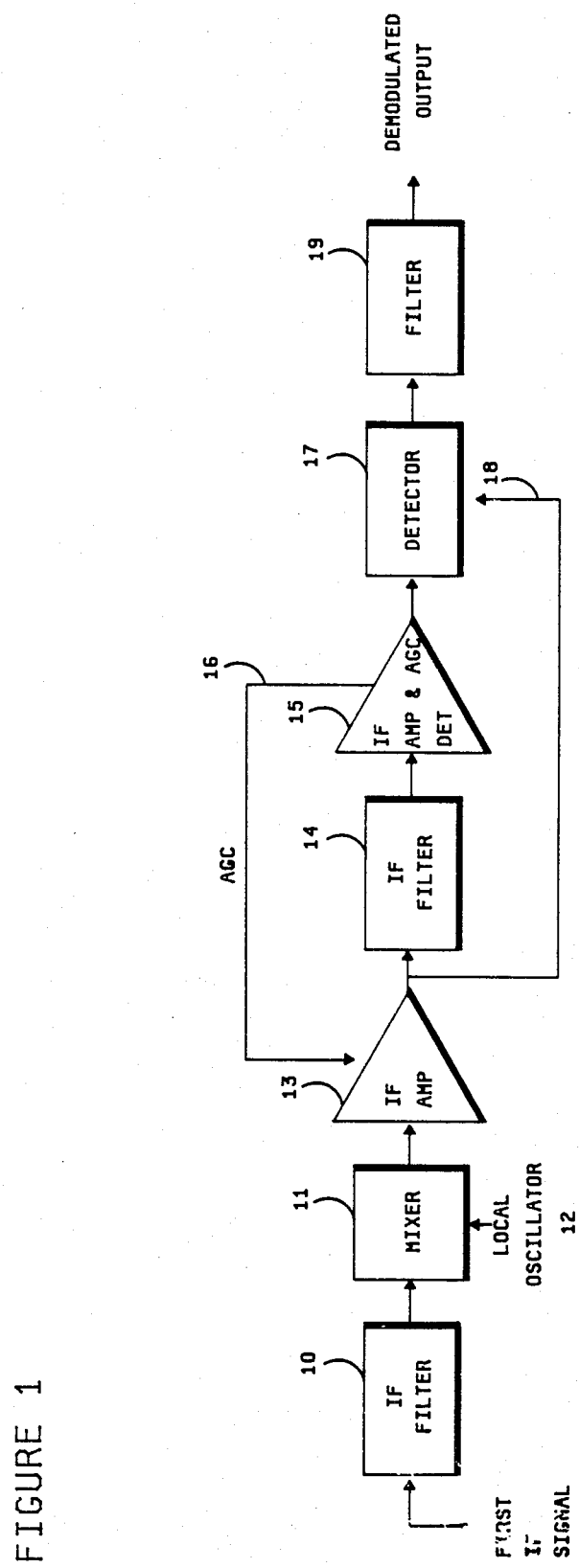
FIG. 1 is a block diagram of a portion of a receiver showing a preferred embodiment of my novel differential detector.

In FIG. 1 is shown a portion of an FM receiver configured for operation using my novel differential detector. My novel detector utilizes a detector 17 which may be an active device known as a double balanced mixer such as an MC1496 manufactured by both Motorola and National Semiconductor. Detector 17 may also be a passive device such as the model SRA-1 mixer manufactured by Mini Circuits Laboratories of Brooklyn, N.Y. These conventional mixers operate in a manner known in the art and may be used in differential detectors as described in the aforementioned article to demodulate frequency modulated and phase modulated signals input thereto. IF amplifier 13 may be an MC1349 and IF amplifier/AGC detector 15 may be an MC1330, both available from Motorola.

In accordance with the teaching of my invention I eliminate the need for the typical delay element which is the most significant part of prior art differential detectors. Also in accordance with the teaching of my invention I rearrange some of the circuits typically found in a double conversion super heterodyne FM receiver, as shown in FIG. 1, and utilize the delay introduced by a conventional IF filter typically found in FM and PM receivers to introduce the delay required for the proper demodulation of the IF signal in detector 17. An advantage to using the IF filter as the delay element is that an IF filter may have characteristics such as phase linearity that would have to be duplicated in delay lines in the prior art.

In FIG. 1 a first IF signal from a mixing stage (not shown) in a double conversion super heterodyne receiver is filtered by IF filter 10 and then down converted a second time by mixing a signal output from local oscillator 12 with the first IF signal. The signal output from mixer 11 is amplified by IF amplifier 13 and then is filtered by IF filter 14. The signal output from IF filter 14 is then applied to IF amplifier and AGC detector 15 where an AGC signal is derived which is applied over AGC lead 16 to IF amplifier 13 to stabilize the gain of the receiver in a manner well known in the art. Detector 17 has two inputs. The first input is the IF signal output from circuit 15 and the second input is the IF signal input to IF filter 14. Due to the delay inherent in IF filter 14 the first signal input to detector 17 from circuit 15 is delayed with respect to the second signal input to detector 17 over lead 18 from the output of IF amplifier 13. Detector 17 combines these two signals and provides an output signal which is the demodulated IF signal. In addition, the demodulation process yields adjacent channel unwanted signals not typically present in the output of prior art differential detectors. Other unwanted signals present in the demodulated signal output from prior art differential detectors are also present in the signal output from detector 17.

Filter 19 is provided to remove these unwanted signals. Accordingly, band reject and/or notch sections are added to the typical low pass filter of the prior art to most effectively remove all these unwanted signals from the demodulated signal output from filter 19.

Figure 2:
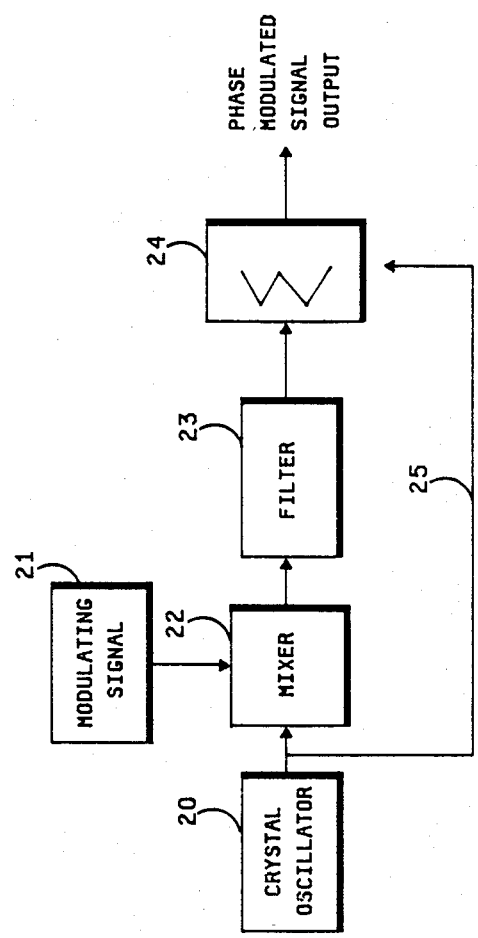
FIG. 2 is a block diagram of an alternative embodiment of the invention used in a phase modulator.

The teaching of my invention may also be utilized in an alternative embodiment of my invention in a phase modulator. This alternative embodiment of my invention is shown in FIG. 2. In such a phase modulator the signal output from a crystal oscillator 20, which signal is the carrier signal to be modulated, is first mixed with a modulating signal 21 in a mixer 22 and the output of the mixer 22 is then passed through a filter 23 that most importantly introduces delay and also removes any unwanted signal components of the mixing process. The filtered and delayed signal output from filter 23 is then summed with the undelayed carrier signal output from crystal oscillator 20 using a summer 24, and the signal output from summer 24 is the phase modulated signal output. The phase modulated signal will exhibit the shaping properties of filter 23.

While what has been described hereinabove is one embodiment of the invention, it will be obvious to those skilled in the art that numerous changes and modifications may be made without departing from the scope of the invention. For example, the conventional elements of an FM receiver may be rearranged differently than shown in FIG. 1 while still achieving the desired demodulation. In addition, additional delay or gain may be introduced into path 18 as desired in specific applications. Further, my novel detector may also be utilized in a single conversion super heterodyne FM or PM receiver. More importantly, in other embodiments of the invention the delay required for proper operation of my differential detector may be obtained from bandwidth restricting devices in a receiver other than IF filters. These may be various combinations of resistive, inductive and capacitive components. Further, signals required for the proper operation of my detector may be obtained from any elements in a receiver that introduce delay. My invention also need not be used with a receiver, but may be used with any circuitry through which a frequency or phase modulated signal passes and it is desired to demodulate the modulated signal for whatever reason. Examples of this are in a repeater, test equipment or at a transmitter.

What I claim is:

1. A demodulator for demodulating a frequency or phase modulated carrier signal to obtain a demodulated signal comprising
    at least one intermediate frequency (IF) filter for delaying a modulated carrier signal for subsequent mixing with the undelayed modulated carrier signal,
    amplifying means for amplifying the output of said IF filter including automatic gain control for controlling the gain of said amplifying means, and
    mixing means for mixing said modulated carrier signal with said delayed modulated carrier signal whereby a demodulated signal is obtained.

2. A demodulator for demodulating a frequency or phase modulated carrier signal to obtain a demodulated signal comprising
    at least one IF filter, which operates on frequencies from about 2 megahertz to about 50 megahertz, for delaying a modulated carrier signal for subsequent mixing with the undelayed modulated carrier signal,
    amplifying means for amplifying the output of said IF filter including automatic gain control for controlling the gain of said amplifying means, and
    mixing means for mixing said modulated carrier signal with said delayed modulated carrier signal whereby a demodulated signal is obtained.

* * * * *